United States Patent
Pruijmboom et al.

[11] Patent Number: 5,554,256
[45] Date of Patent: Sep. 10, 1996

[54] METHOD OF MANUFACTURING A SEMICONDUCTOR DEVICE HAVING A SEMICONDUCTOR BODY WITH FIELD INSULATION REGIONS FORMED BY GROOVES FILLED WITH INSULATING MATERIAL

[75] Inventors: Armand Pruijmboom; Ronald Koster; Cornelis E. Timmering; Ronald Dekker, all of Eindhoven, Netherlands

[73] Assignee: U.S. Philips Corporation, New York, N.Y.

[21] Appl. No.: 310,824

[22] Filed: Sep. 22, 1994

[30] Foreign Application Priority Data

Sep. 23, 1993 [BE] Belgium ............................. 09300997

[51] Int. Cl.⁶ .............................................. H01L 21/00
[52] U.S. Cl. ....................... 156/643.1; 156/649.1; 156/657.1; 156/659.11; 437/238; 216/39; 216/41
[58] Field of Search ................ 156/643.1, 653.1, 156/648.1, 649.1, 657.1, 659.11, 662.1; 437/238, 225; 216/11, 19, 39, 41

[56] References Cited

U.S. PATENT DOCUMENTS

| | | | |
|---|---|---|---|
| 4,892,614 | 1/1990 | Chapman et al. | 156/648.1 |
| 5,281,550 | 1/1994 | Ducreux | 437/65 |
| 5,346,584 | 9/1994 | Nasr et al. | 156/636.1 |
| 5,346,862 | 9/1994 | Schleicher et al. | 156/649.1 |

FOREIGN PATENT DOCUMENTS

| | | |
|---|---|---|
| 0166141 | 1/1986 | European Pat. Off. . |
| 0542647 | 5/1993 | European Pat. Off. . |
| 6318504 | 7/1988 | Japan . |

*Primary Examiner*—William Powell
*Attorney, Agent, or Firm*—Steven R. Biren

[57] ABSTRACT

A method of manufacturing a semiconductor device comprising a semiconductor body (1) with field insulation regions (14) formed by grooves (10; 24) filled with an insulating material (13) is disclosed. The grooves (10; 24) are etched into the semiconductor body (1) with the use of an etching mask (9) formed on an auxiliary layer (6) provided on a surface (5) of the semiconductor body (1). The auxiliary layer (6) is removed from the portion (11) of the surface (5) situated next to the etching mask (9) before the grooves (10; 24) are etched into the semiconductor body (1), and the auxiliary layer (6) is removed from the edge (12) of the surface (5) situated below the etching mask (9) after the grooves (10; 24) have been etched into the semiconductor body. Furthermore, a layer (13) of the insulating material is deposited on the semiconductor body (1), whereby the grooves (10; 24) are filled and the edge (12) of the surface (5) situated below the etching mask (9) is covered. Then the semiconductor body is subjected to a treatment whereby material is taken off parallel to the surface (5) down to the auxiliary layer (6), and finally the remaining portion of the auxiliary layer (6) is removed. Field insulation regions are thus formed which extend over an edge (12) of the active regions (15) surrounded by the field insulation regions (14) with a strip (18) which has no overhanging edge.

10 Claims, 3 Drawing Sheets

METHOD OF MANUFACTURING A SEMICONDUCTOR DEVICE HAVING A SEMICONDUCTOR BODY WITH FIELD INSULATION REGIONS FORMED BY GROOVES FILLED WITH INSULATING MATERIAL

BACKGROUND OF THE INVENTION

The invention relates to a method of manufacturing a semiconductor device comprising a semiconductor body with field insulation regions formed by grooves filled with insulating material, by which method the grooves are etched into the semiconductor body with the use of an etching mask formed on an auxiliary layer provided on a surface of the semiconductor body, the auxiliary layer is removed from the portion of the surface situated next to the etching mask and from an edge of the surface situated below the etching mask, and a layer of the insulating material is deposited on the semiconductor body, whereby the grooves are filled and the edge of the surface situated below the etching mask is covered, after which the semiconductor body is subjected to a treatment by which material is removed parallel to the surface down to said auxiliary layer and finally the remaining portion of the auxiliary layer is removed.

Since the material reduction which takes place parallel with the surface of the semiconductor body is stopped the moment the auxiliary layer is reached, the insulated material deposited on the edge of the surface situated below the etching mask is not removed. Field insulation regions are thus formed which extend over an edge of active regions of the semiconductor body surrounded by the field insulation regions. These field insulation regions may be provided by processes in which no treatments at temperatures higher than 650° C. are required. Doping profiles already present in the semiconductor body, accordingly, are not interfered with by this method of providing the field oxide regions.

Doped surface zones may subsequently be formed in the active regions of the semiconductor body surrounded by the field insulation regions. For example, a layer of a doped semiconductor material is deposited on the semiconductor body then, after which the semiconductor body is subjected to a heat treatment whereby dopant diffuses from this layer into the semiconductor body. Since the edge of the active regions is covered by a strip of insulating material during this, it is prevented that dopants penetrate to an undesirable depth into the edge of the active regions during this heat treatment. This renders it impossible for pn junctions already present in the active regions to be short-circuited.

JP-A-63/185043 discloses a method of the kind mentioned in the opening paragraph whereby the semiconductor body is subjected to an isotropic etching treatment before the grooves are etched into the semiconductor body, which treatment is continued until the auxiliary layer has been removed both from the portion of the surface situated next to the etching mask and from the edge of the surface situated below the mask. The grooves are then etched into the semiconductor body in that the latter is subjected to an anisotropic etching treatment.

A pattern of electric conductors may be applied on the active regions which were thus formed and surrounded by the field insulation regions. The semiconductor body is then covered with a layer of electrically conducting material which is subsequently provided with a photoresist mask corresponding to the pattern to be formed, after which the pattern is etched into the electrically conducting layer. The electric conductors formed interconnect *inter alia* doped surface zones. It is found in practice that short-circuits may occur in the pattern of electric conductors thus provided.

SUMMARY OF THE INVENTION

The invention has for its object *inter alia* to provide a method of manufacturing a semiconductor device comprising a semiconductor body with field insulation regions formed by grooves filled with insulating material, which grooves extend over an edge of the active regions of the semiconductor body surrounded by the field insulation regions, while the occurrence of short-circuits is counteracted in the formation of a pattern of electric conductors as described above.

According to the invention, the method mentioned in the opening paragraph is for this purpose characterized in that the auxiliary layer is removed from the portion of the surface situated next to the etching mask before the grooves are etched into the semiconductor body, and in that the auxiliary layer is removed from the edge of the surface situated below the etching mask after the grooves have been etched into the semiconductor body. The occurrence of said short-circuits in the pattern of electric conductors extending over the field insulation regions and the active regions is strongly counteracted thereby.

The invention is based on the following recognition. In the known method, the auxiliary layer is etched isotropically until the auxiliary layer has been removed both from the portion of the surface situated next to the etching mask and from the edge of the surface situated below the mask. During this etching treatment, which may be carried out either with an etching liquid or with an etching plasma, the auxiliary layer is etched from its upper side. During this, the auxiliary layer is given a profile below the etching mask which encloses an acute angle with the surface of the semiconductor body. The strip of the field insulation regions which is deposited on the edge of the active regions lies against the auxiliary layer after the grooves have been filled. Accordingly, the strip exhibits an overhanging edge on the active regions after the removal of the remaining portion of the auxiliary layer. Given the formation of a pattern of conductors in the manner described above, conducting tracks may be formed below this edge, which cause the short-circuits mentioned. In the method according to the invention, the auxiliary layer is given a profile below the etching mask which does not enclose an acute angle with the surface of the semiconductor body. The formation of conductor tracks which cause the said short-circuits is strongly counteracted thereby.

A preferred embodiment of the method according to the invention is characterized in that the auxiliary layer is etched away anisotropically from the portion of the surface situated next to the etching mask, the grooves are subsequently etched anisotropically into the semiconductor body, and after that the auxiliary layer is etched away isotropically from the edge of the surface situated below the etching mask. During isotropic etching of the auxiliary layer, the latter is etched from its flat side which is exposed at that moment and is given a profile which is directed transversely to the surface of the semiconductor body. The strip of the field insulation regions, which is deposited on the edge of the active regions, as a result shows a substantially straight edge on the active regions after removal of the auxiliary layer. The formation of the conductor tracks which cause the said short-circuits is strongly counteracted thereby. In addition, the active regions have dimensions which are practically identical to those of the etching mask in this embodiment of the method.

Another preferred embodiment of the method according to the invention is characterized in that the auxiliary layer is etched away anisotropically from the portion of the surface situated next to the etching mask, the grooves are subsequently etched isotropically into the semiconductor body, and the auxiliary layer is then etched away isotropically from the edge of the surface situated below the etching mask. The grooves etched in this manner extend to below the auxiliary layer. When the semiconductor body is now subjected to the isotropic etching treatment, whereby a strip of the auxiliary layer is removed from an edge of the surface situated below the etching mask, the auxiliary layer is etched away from its lower side from the etched grooves. The auxiliary layer is then in fact etched away from the etching mask, the active region being used as a mask. The auxiliary layer accordingly gets a profile which encloses an obtuse angle with the surface of the semiconductor body, and the field insulation regions are given a strip situated on the active regions and having a profile which encloses an acute angle with the surface. The formation of conductor tracks which cause the said short-circuits has become practically impossible as a result. In this embodiment, the active regions have dimensions smaller than those of the etching mask. This should accordingly be taken into account in the design of semiconductor devices manufactured by this embodiment of the method.

The etched grooves may be filled with insulating material in that a layer of this material is provided to such a depth that it has a substantially plane surface, upon which an etching treatment is carried out. The layer of insulting material then has a surface which runs practically parallel to the surface of the device, and a material reduction which proceeds parallel to the surface is obtained by the etching treatment. If a thinner layer of insulating material is provided, it will have a surface which more or less follows the etched grooves. In that case a photoresist layer may be provided on the layer of insulating material to such a thickness that it shows a practically plane surface. When an etching treatment is subsequently carried out, by which the photoresist and the insulating material are etched at practically the same rate, then again a material reduction is obtained which proceeds parallel to the surface of the semiconductor body. Preferably, the semiconductor body is subjected to a chemical-mechanical polishing treatment after the deposition of the layer of insulating material, by which treatment the insulating material and the subjacent etching mask are taken off parallel to the surface down to said auxiliary layer. When a chemical-mechanical polishing treatment is used, it is immaterial whether the layer of insulating material itself has a comparatively plane surface or not. The layer of insulating material need not be provided to a comparatively great thickness, and a photoresist layer is unnecessary.

BRIEF DESCRIPTION OF THE DRAWING

The invention will be explained below in more detail, by way of example, with reference to the drawing, in which.

DESCRIPTION OF PREFERRED EMBODIMENT

Figure 1:
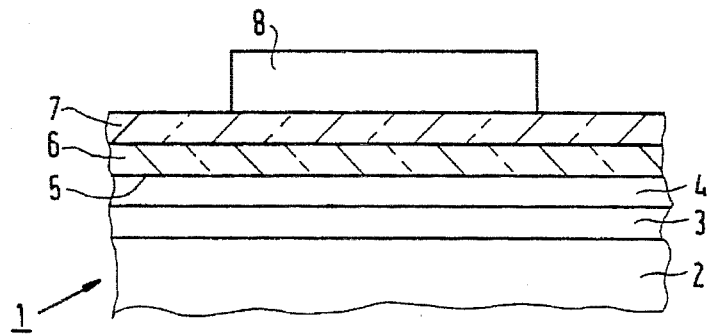
FIGS. 1 to 9 diagrammatically and in cross-section show a number of stages in the manufacture of a semiconductor device made by a first embodiment of the method according to the invention.
Figure 2:
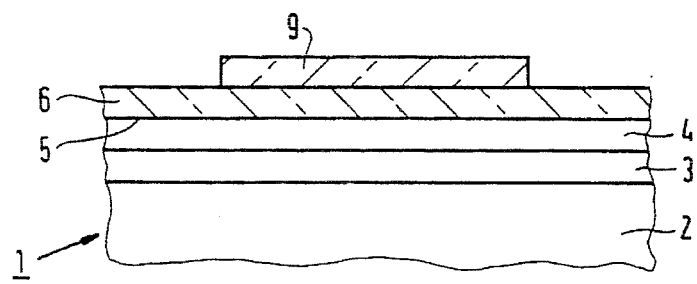

FIGS. 1 to 8 diagrammatically and in cross-section show a number of stages in the manufacture of a semiconductor device comprising a semiconductor body 1 with field insulation regions 14 formed by grooves 10 filled with insulating material 13. The semiconductor 1 in this example is provided with a surface layer 2 of n-type doped silicon with a doping concentration of $10^{20}$ atoms per cc, provided with an n-type epitaxially grown, approximately 0.3 μm thick n-type layer 3 with a doping concentration of $10^{17}$ atoms per cc. An approximately 0.1 μm thick p-type surface zone 4 with a doping concentration of $3.10^{18}$ atoms per cc has already been provided in this layer 3 in a usual manner. Instead of this surface zone 4, a layer of, for example, p-type $Si_{1-x}Ge_x$ with $0.1<x<0.5$ may alternatively be grown epitaxially on the layer 3. An approximately 0.15 μm thick auxiliary layer 6 of silicon nitride and an approximately 0.2 μm thick masking layer 7 of silicon oxide are deposited on a surface 5 of the semiconductor body 1. An approximately 20 nm thick layer of silicon oxide (not shown) may be provided below the auxiliary layer 6. A photoresist mask 8 is provided in usual manner on the auxiliary layer 6, with which mask an etching mask 9 is etched into the masking layer 7. Grooves 10 are etched into the semiconductor body 1 with the use of the etching mask 9 which is formed on the auxiliary layer 6 provided on the surface 5 of the semiconductor body 1.

Figure 5:
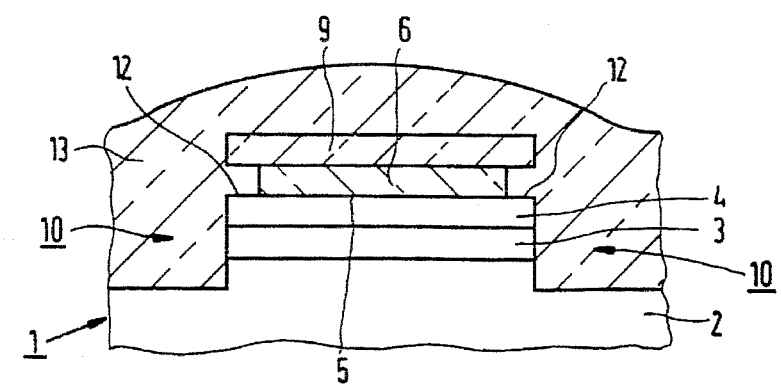
Figure 6:
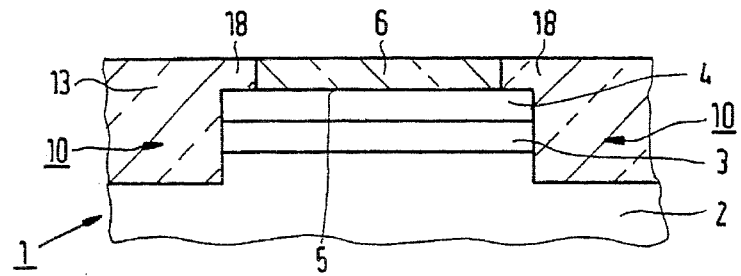
Figure 7:
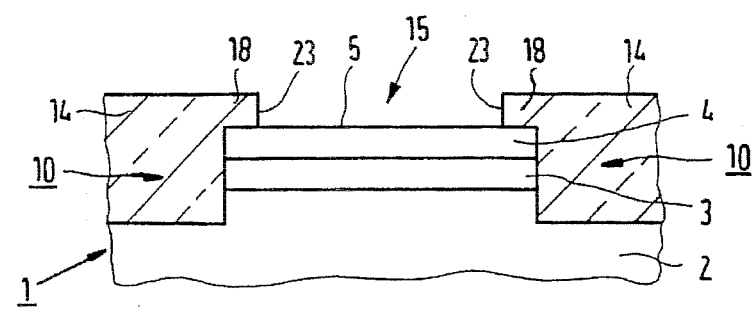
Figure 8:
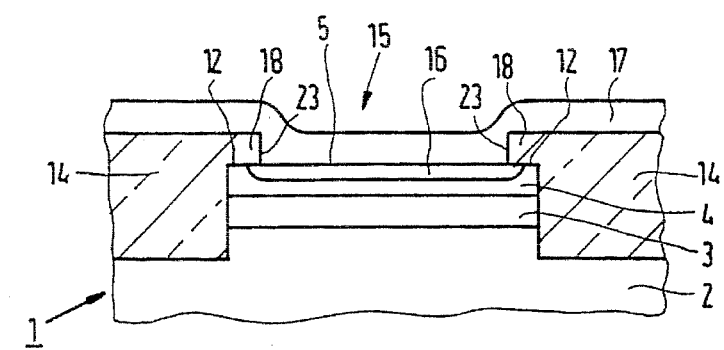
Figure 9:
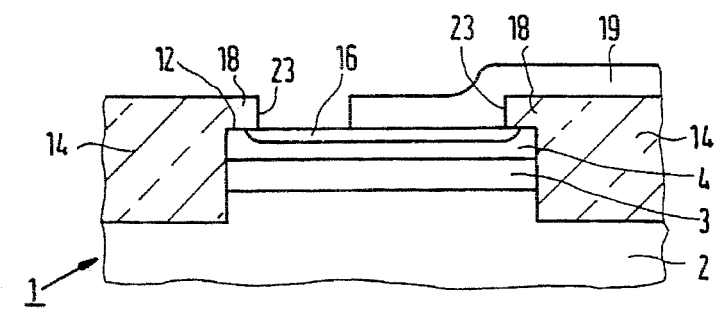

After the photoresist mask 8 has been removed, the auxiliary layer 6 is removed from the portion 11 of the surface 5 situated next to the etching mask 8 and from an edge 12 of the surface 5 situated below the etching mask 8. Then a layer 13 of the insulating material with which the grooves 10 are to be filled is deposited on the semiconductor body I. The grooves 10 are filled thereby and the edge 12 of the surface 5 situated below the etching mask 9 is covered. As is shown in FIGS. 5 and 6, the semiconductor body 1 is then subjected to a treatment by which material is taken off parallel to the surface 5 down to said auxiliary layer 6, and finally the remaining portion of the auxiliary layer 6 is eliminated.

Since the material reduction which proceeds parallel to the surface of the semiconductor body 1 is stopped the moment the auxiliary layer 6 is reached, the insulating material 13 deposited on the edge 12 of the surface 5 situated below the etching mask is not removed. Field insulation regions 14 are thus formed, extending over the edge 12 of active regions 15 of the semiconductor body 1 surrounded by the field insulation regions 14. These field insulation regions 14 may be provided in usual manner by processes in which no treatments at a temperature higher than 650° C. are required. Doping profiles of the epitaxially grown layer 3 and the surface zone 4 already present in the semiconductor body 1 are accordingly not interfered with by the creation of the field oxide regions.

Doped surface zones 16 are subsequently formed in the active regions 15 of the semiconductor body surrounded by the field insulation regions 14. A layer 17 of n-type doped polycrystalline silicon with a doping of $10^{21}$ atoms per cc is deposited on the semiconductor body 1, after which the semiconductor body 1 is subjected to a heat treatment whereby dopant diffuses from this layer into the semiconductor body. Since the edge 12 of the active regions 15 is covered by a strip of insulating material 18 during this, it is prevented that dopant penetrates to at, undesirable depth into the edge 12 of the active regions 15 during this heat treatment. Thus it is prevented that the surface zone 16 and the epitaxially grown layer 3 are interconnected in the active regions 15, whereby any pn junctions present between the layers 16, 4 and 3 would be short-circuited.

A pattern of electric conductors can be provided on the active regions 15 thus formed and surrounded by the field insulation regions 14. In this case this would refer to the layer of n-type doped polycrystalline silicon 17. It would be alternatively possible, however, to cover the semiconductor body 1 with a layer of a different electrically conducting material after removal of the layer 17. The layer 14 is provided with a photoresist mask (not shown) corresponding to the pattern to be formed, after which the conductors 19 are etched into the layer of polycrystalline silicon 17. The electric conductors formed interconnect *inter alia* doped surface zones 16 across the field oxide regions 14.

Figure 3:
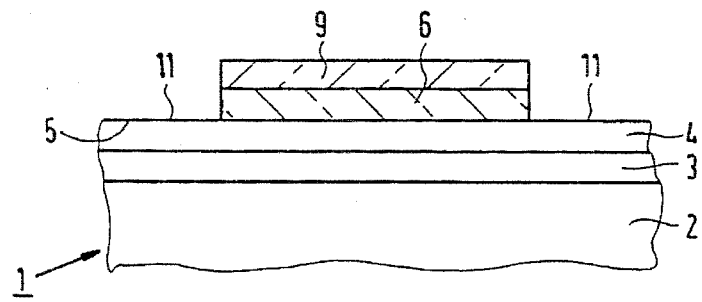
Figure 4:
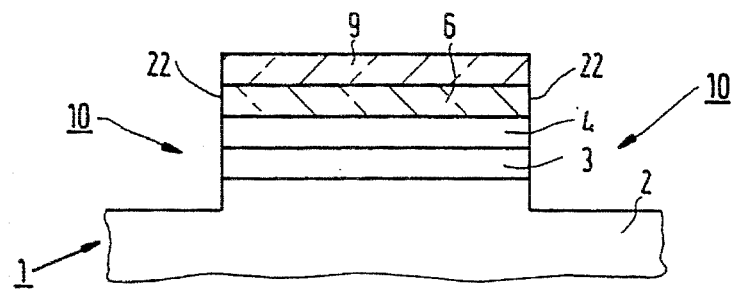
Figure 12:
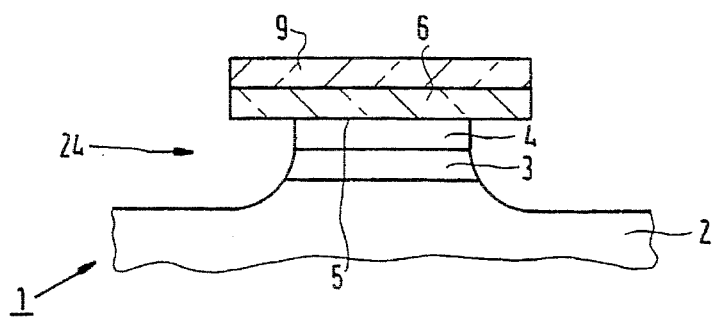
FIGS. 12 to 15 diagrammatically and in cross-section show several stages in the manufacture of a semiconductor device made by an alternative embodiment of the method according to the invention.

According to the invention, as shown in FIGS. 3, 4 and 5 and in FIG. 12, the auxiliary layer 6 is removed from the portion 11 of the surface 5 situated next to the etching mask 9 before the grooves 10 are etched into the semiconductor body, and the auxiliary layer 6 is removed from the edge 12 of the surface 15 situated below the etching mask 9 after the grooves 10 have been etched into the semiconductor body 1. The occurrence of short-circuits in the pattern of electric conductors 19 extending over the field insulation regions 14 and the active regions 15 is strongly counteracted thereby.

Figure 10:
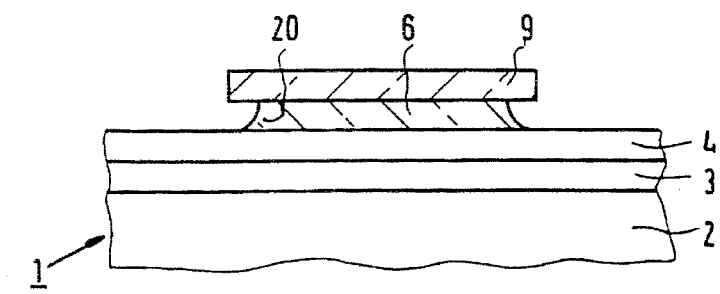
FIGS. 10 and 11 diagrammatically and in cross-section show stages in the manufacture of a semiconductor body when the method according to the invention is not used.
Figure 11:
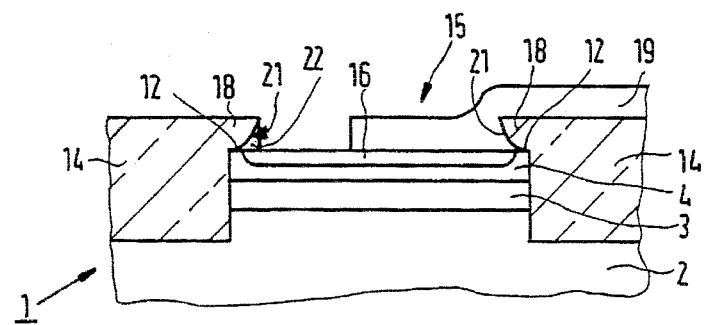
Figure 13:
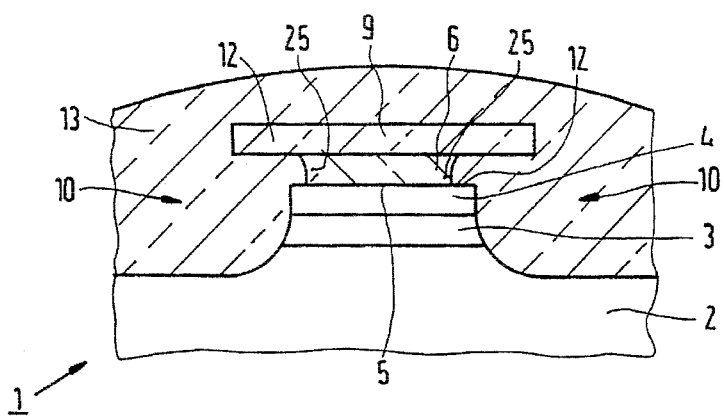
Figure 14:
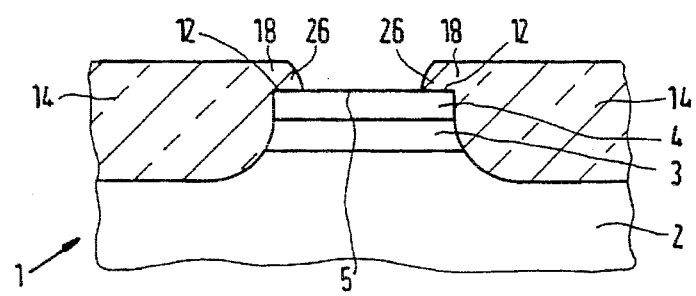
Figure 15:
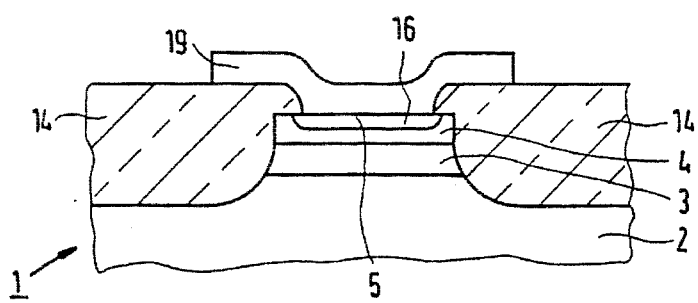

If the auxiliary layer 6 were etched away both from the portion 11 of the surface 5 situated next to the etching mask 9 and from the edge 12 of the surface 5 situated below the mask 9 before the grooves 10 are etched, then the auxiliary layer 6 would be etched from its upper side during this etching treatment, which may be carried out equally well with an etching liquid and with an etching plasma. The auxiliary layer 6 would then be given a profile which encloses an acute angle 20 with the surface 5 of the semiconductor body 1 below the etching mask 6, as indicated diagrammatically in FIG. 10. The strip of the field insulation regions 14 deposited on the edge 12 of the active regions will lie against the auxiliary layer 6 after filling of the grooves 10. The strip 18 accordingly has an overhanging edge 21 on the active regions 15 after the removal of the remaining portion of the auxiliary layer 6. Given the formation of a pattern of conductors in a manner as described above, conductor tracks 21 may be formed below this edge 21, which may cause short-circuits between various conductor tracks 19. In the method according to the invention, the auxiliary layer 9 is given a profile which does not enclose an acute angle with the surface 5 of the semiconductor body 1 below the etching mask 9, as is indicated diagrammatically in FIGS. 5 and 13. The formation of conductor tracks which cause the said short-circuits is strongly counteracted thereby.

In the embodiment of the method as shown in FIGS. 1 to 9, according to the invention, the auxiliary layer 6 is etched away anisotropically from the portion 11 of the surface 5 situated next to the etching mask 9, after which the grooves 10 are etched anisotropically into the semiconductor body 1 and the auxiliary layer 6 is etched away isotropically from the edge 12 of the surface 5 situated below the etching mask 9. During isotropic etching of the auxiliary layer 6, the latter is etched away from its plane side 22 which is exposed then, and is given a profile which is directed transversely to the surface 5 of the semiconductor body 1. The strip 18 of the field insulation regions 14 which is deposited on the edge 12 of the active regions 15 accordingly has a practically straight edge 23 on the active regions 15 after removal of the auxiliary layer 6. The formation of conductor tracks which cause the said short-circuits is strongly counteracted thereby. In addition, the active regions 15 have lateral dimensions which are substantially equal to those of the etching mask 9 in this embodiment of the method.

An alternative embodiment of the method is shown in FIGS. 1 to 3 and 12 to 15. In this embodiment, according to the invention, the auxiliary layer 6 is etched away anisotropically from the portion 11 of the surface 5 situated next to the etching mask 9, as it is in the previous embodiment and shown in FIG. 3. Subsequently, grooves 24 are etched into the semiconductor body 1 isotropically. After that, the auxiliary layer 6 is etched away isotropically from the edge 12 of the surface 5 situated below the etching mask 9. The grooves 24 thus etched extend to below the auxiliary layer 6. When the semiconductor body 1 is now subjected to the isotropic etching treatment, whereby the auxiliary layer 6 is removed from an edge 12 of the surface 5 situated below the etching mask 9, the auxiliary layer 6 is etched away from its lower side from the etched grooves 24. The auxiliary layer 6 is then in fact etched from the etching mask 9, the active regions 15 serving as a mask. The auxiliary layer 6 accordingly gets a profile which encloses an obtuse angle 25 with the surface 5 of the semiconductor body 1. The field insulation regions 14 then have a strip situated on the active regions 15 with a profile enclosing an acute angle 26 with the surface 5. The formation of the conductor tracks which cause the said short-circuits has become practically impossible as a result. In this embodiment, the active regions 15 have lateral dimensions which are smaller than those of the etching mask 9. This should be included in the calculations during the design of semiconductor devices for which this embodiment of the method is used.

The etched grooves 10, 24 are filled with insulating material in that, after the deposition of the layer of insulating material 13, the semiconductor body 1 is subjected to a chemical-mechanical polishing treatment whereby the insulating material 13 and the subjacent etching mask 9 are taken off parallel to the surface 5 down to the auxiliary layer 6. It is immaterial in the case of a chemical-mechanical polishing treatment whether the layer of insulating material 13 itself has a comparatively plane surface or not. The layer of insulating material 13 need not be applied with a comparatively great thickness and a photoresist layer is unnecessary.

We claim:

1. A method of manufacturing a semiconductor device having a semiconductor body with field insulation regions formed by grooves filled with insulating material, comprising the steps of etching the grooves into the semiconductor body with the use of an etching mask formed on an auxiliary layer provided on a surface of the semiconductor body, removing the auxiliary layer from the portion of the surface situated next to the etching mask and from an edge of the surface situated below the etching mask, and depositing a layer of the insulating material on the semiconductor body, whereby the grooves are filled and the edge of the surface situated below the etching mask is covered, and then treating the semiconductor body to remove material parallel to the surface down to said auxiliary layer and then removing the remaining portion of the auxiliary layer, the auxiliary layer being removed from the portion of the surface situated next to the etching mask before the grooves are etched into the semiconductor body, and the auxiliary layer being removed from the edge of the surface situated below the etching mask after the grooves have been etched into the semiconductor body.

2. A method as claimed in claim 1, further comprising etching away the auxiliary layer anisotropically from the portion of the surface situated next to the etching mask, subsequently etching the grooves anisotropically into the semiconductor body, and than etching away the auxiliary layer isotropically from the edge of the surface situated below the etching mask.

3. A method as claimed in claim 1, further comprising etching away the auxiliary layer anisotropically from the portion of the surface situated next to the etching mask, subsequently etching the grooves isotropically into the semiconductor body, and then etching away the auxiliary layer isotropically from the edge of the surface situated below the etching mask.

4. A method as claimed in claim 1, further comprising subjecting the semiconductor body to a chemical-mechanical polishing treatment after the deposition of the layer of insulating material, by which treatment the insulating material and the subjacent etching mask are taken off parallel to the surface down to said auxiliary layer.

5. A method as claimed in claim 1, further comprising providing the etching mask in a layer of silicon oxide which was deposited on an auxiliary layer of silicon nitride provided on a semiconductor body made of silicon.

6. A method as claimed in claim 2, further comprising subjecting the semiconductor body to a chemical-mechanical polishing treatment after the deposition of the layer of insulating material, by which treatment the insulating material and the subjacent etching mask are taken off parallel to the surface down to said auxiliary layer.

7. A method as claimed in claim 3, further comprising subjecting the semiconductor body to a chemical-mechanical polishing treatment after the deposition of the layer of insulating material, by which treatment the insulating material and the subjacent etching mask are taken off parallel to the surface down to said auxiliary layer.

8. A method as claimed in claim 2, further comprising providing the etching mask in a layer of silicon oxide which was deposited on an auxiliary layer of silicon nitride provided on a semiconductor body made of silicon.

9. A method as claimed in claim 3, further comprising providing the etching mask in a layer of silicon oxide which was deposited on an auxiliary layer of silicon nitride provided on a semiconductor body made of silicon.

10. A method as claimed in claim 4, further comprising providing the etching mask in a layer of silicon oxide which was deposited on an auxiliary layer of silicon nitride provided on a semiconductor body made of silicon.

* * * * *